(12) United States Patent
Morita (10) Patent No.: US 9,668,395 B2
(45) Date of Patent: May 30, 2017

(54) COMPONENT MOUNTING LINE TRACEABILITY INFORMATION MANAGEMENT SYSTEM AND TRACEABILITY INFORMATION MANAGEMENT METHOD (71) Applicant: FUJI MACHINE MFG. CO., LTD., Chiryu (JP)

(72) Inventor: Yukitoshi Morita, Okazaki (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/123,179

(22) PCT Filed: Mar. 5, 2014

(86) PCT No.: PCT/JP2014/055648
§ 371 (c)(1),
(2) Date: Sep. 1, 2016

(87) PCT Pub. No.: WO2015/132905
PCT Pub. Date: Sep. 11, 2015

(65) Prior Publication Data
US 2017/0079169 A1 Mar. 16, 2017

(51) Int. Cl.
*G06K 19/06* (2006.01)
*H05K 13/08* (2006.01)
*G06K 19/02* (2006.01)

(52) U.S. Cl.
CPC .......... *H05K 13/08* (2013.01); *G06K 19/022* (2013.01); *G06K 19/06046* (2013.01)

(58) Field of Classification Search
USPC ......................................... 235/494
See application file for complete search history.

(56) References Cited

U.S. PATENT DOCUMENTS 8,140,176 B2 * 3/2012 Sumi .................. H05K 13/0452
29/739

FOREIGN PATENT DOCUMENTS

JP 2011-49478 A 3/2011
JP 2012-169656 A 9/2012
JP 2013-235905 A 11/2013

OTHER PUBLICATIONS

International Search Report Issued Jun. 10, 2014 in PCT/JP2014/055648 Filed Mar. 5, 2014.

* cited by examiner

*Primary Examiner* — Rafferty Kelly
(74) *Attorney, Agent, or Firm* — Oblon, McClelland, Maier & Neustadt, L.L.P.

(57) ABSTRACT

A board ID code label on which a coded board ID is recorded is affixed to circuit board. Provided are a code reading device (camera) that reads a board ID of the circuit board from board ID code label, a code label feeder that supplies provisional board ID code label, and a code label affixing device that affixes provisional board ID code label to circuit board when reading of the board ID fails. Management is performed by linking traceability information to the read board ID or provisional board ID for each circuit board and registering the information in database.

7 Claims, 5 Drawing Sheets

COMPONENT MOUNTING LINE TRACEABILITY INFORMATION MANAGEMENT SYSTEM AND TRACEABILITY INFORMATION MANAGEMENT METHOD

TECHNICAL FIELD

The application relates to a component mounting line traceability information management system and traceability information management method for managing traceability information (production history information) of a board on which components are mounted produced at a component mounting line that mounts components on a circuit board.

BACKGROUND ART

There are known items (refer to patent literature 1 to 3) that, for the purpose of quality management, safety management, and so on, register and manage traceability information for each circuit board for boards mounted with components produced at a component mounting line. Conventional component mounting line traceability information management systems perform management by a board ID code label with a barcode of board identification information (referred to as "board ID" below) being affixed to a circuit board in advance, the board ID being read by a barcode reader or camera from the board ID code label of the circuit board loaded into the component mounting line, and traceability information of the board on which components are mounted being linked to the board ID and registered in a database.

CITATION LIST

Patent Literature

Patent Literature 1: JP-A-2011-49478
Patent Literature 2: JP-A-2012-169656
Patent Literature 3: JP-A-2013-235905

BRIEF SUMMARY

Technical Problem

However, during operation (during production) of the component mounting line, there are cases in which failure occurs reading the board ID due to the printed state of the board ID code label or the like, and if reading the board ID fails, production stops and cannot be restarted until an operator performs recovery work such as removing the circuit board for which reading of the board ID failed from the conveyor, thus lowering productivity. It is possible to continue production ignoring the fact that reading the board ID failed, but in this case, it is not possible to manage traceability information of the board on which components are mounted for which reading of the board failed by linking the traceability information to the board ID, thus the traceability information of the board on which components are mounted cannot be checked afterwards.

The present disclosure solves the above problems, and an object thereof is to provide a component mounting line traceability information management system and traceability information management method that is capable of managing traceability information by linking traceability information of a board on which components are mounted to a board ID without stopping production, even in a case in which reading fails of the board ID of a circuit board loaded into the component mounting line.

Solution to Problem

To solve the above problems, the present disclosure is a component mounting line traceability information management system that manages traceability information of a board on which components are mounted produced at the component mounting line provided with a component mounter that mounts components on a circuit board, the component mounting line traceability information management system comprising: a board ID code label affixed to a circuit board that is loaded into the component mounting line, board identification information (hereinafter referred to as "board ID") being coded and stored on the board ID code label; a code reading device that reads the board ID from the board ID code label of the circuit board loaded into the component mounting line; a code label feeder that supplied a provisional board ID code label on which is stored a coded provisional board ID; a code label affixing device that affixes the provisional board ID code label, supplying of which was performed by the code label feeder when the code reading device failed to read the board ID, to the panel ID for which reading failed; and a traceability information management device that performs management by linking traceability information of a board on which components are mounted to the board ID or the provisional board ID read by the code reading device, and registering the traceability information in a database.

With this configuration, when the code reading device fails to read the board ID, a provisional board ID code label supplied by the label feeder is affixed to the circuit board for which reading of the board ID failed, therefore when the code reading device fails to read the board ID, it is possible to register traceability information of the board on which components are mounted in the database linked to the provisional board ID. Thus, an operator may, from boards on which components are mounted that are unloaded from the component mounting line, extract a board on which components are mounted on which is affixed a provisional board ID code label, read the board ID and provisional board ID of the board on which components are mounted by scanning the board ID code label and the provisional board ID code label of the board on which components are mounted with a code reading device such as a barcode reader and send the board ID and the provisional board ID to the traceability information management device, such that the ID of the traceability information of the board on which components are mounted that is registered in the database is changed from the provisional board ID to the board ID. By this, even in a case in which the code reading device fails to read the board ID of a circuit board loaded into the component mounting line, the traceability information management device is able to perform management by linking the traceability information of the board on which components are mounted to the board ID and registering the information without stopping production. Even in a case in which the code reading device fails to read the board ID due to, for example, the printed state of the board ID code label of the circuit board loaded into the component mounting line, the board ID is able to be read by an operator manually scanning the board ID code label using a code reading device such as a barcode reader. Also, by changing the traceability information ID of the board on which components are mounted from the provisional board ID to the proper board ID, even in a case in which new information is added to the traceability information of the board on which components at a later stage, the traceability information management device is able to perform management using the same board ID as from a previous stage.

In this case, a barcode reader or the like may be used as the code reading device, or the board ID may be read by a mark imaging camera provided on the component mounter imaging the board ID code label of the circuit board with the mark imaging camera and performing image processing, and the provisional board ID may be read by the mark imaging camera imaging the provisional board ID code label affixed to the circuit board by the code label affixing device when reading of the panel ID fails and performing image processing. By this, the mark imaging camera loaded on the component mounter can also be used as the code reading device, reading both the board ID and the provisional board ID, therefore a dedicated code reading device (such as a barcode reader or an external camera) does not have to be provided, and the system configuration can be simplified.

Note that, the present disclosure is not limited to a configuration in which the provisional board ID is read from the provisional board ID code label, the provisional board ID stored on the provisional board ID code label affixed to the circuit board when reading of the board ID fails may be sent from the code label feeder to the traceability information management device.

Also, with the present disclosure, a function acting as a code label affixing device may be provided on the code label feeder, or a suction nozzle of the component mounter may be used as the code label affixing device, and the provided board ID code label supplied by the code label feeder may be picked up by the suction nozzle of the component mounter and affixed to the circuit board for which reading of the board ID failed.

Also, with the present disclosure, the code label feeder may be set on a feeder setting table of the component mounter alongside feeders that supply components. Accordingly, the code label feeder can be set making effective use of an empty slot on the feeder setting table of the component mounter.

Also, the present disclosure may use laser marking, RFIDs, or the like as a "code label".

DESCRIPTION OF EMBODIMENTS

Two specific embodiments of the present disclosure are described below.

First Embodiment

A first embodiment of the present disclosure will be described based on FIGS. 1 to 5. First, the overall configuration of the component mounting line is described based on FIG. 1.

Figure 1:
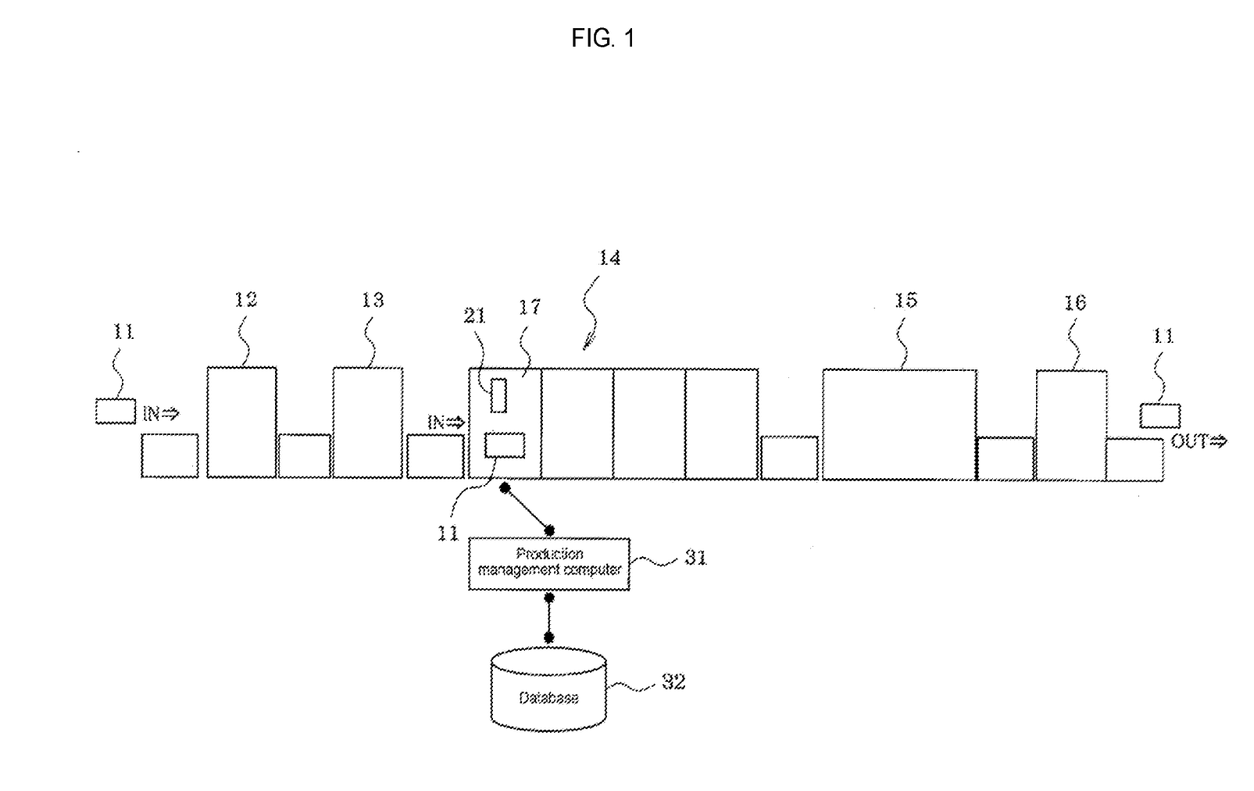
FIG. 1 is a block diagram showing schematically the configuration of a component mounting line which is a first embodiment of the present disclosure.

Solder printer 12, print inspection machine 13, modular component mounter 14, reflow oven 15, optical inspection machine 16, and the like are arranged along a conveyance path of circuit board 11. Modular component mounter 14 is configured from multiple mounter modules 17 arranged in the conveyance direction of circuit board 11.

Figure 2:
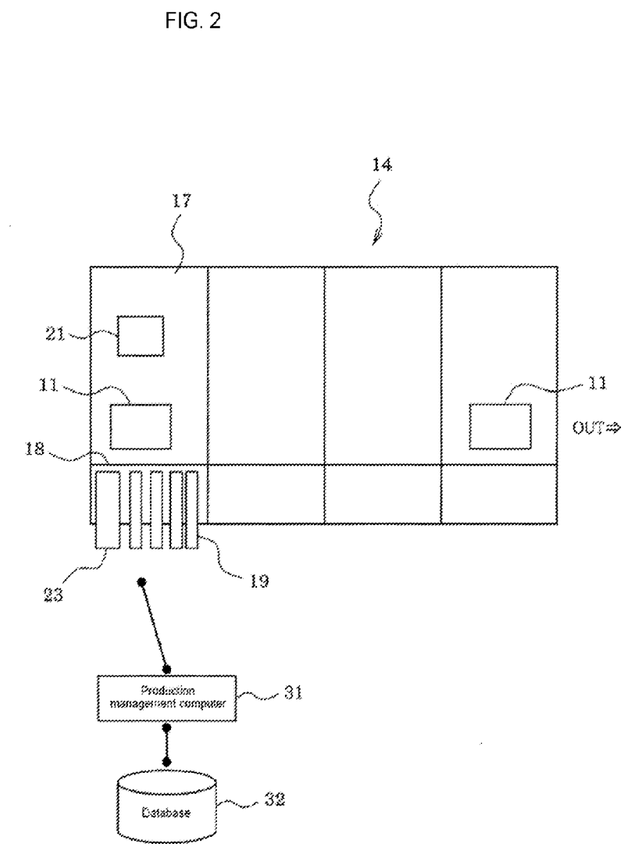
FIG. 2 is a block diagram showing a configuration example of a modular component mounter.
Figure 3:
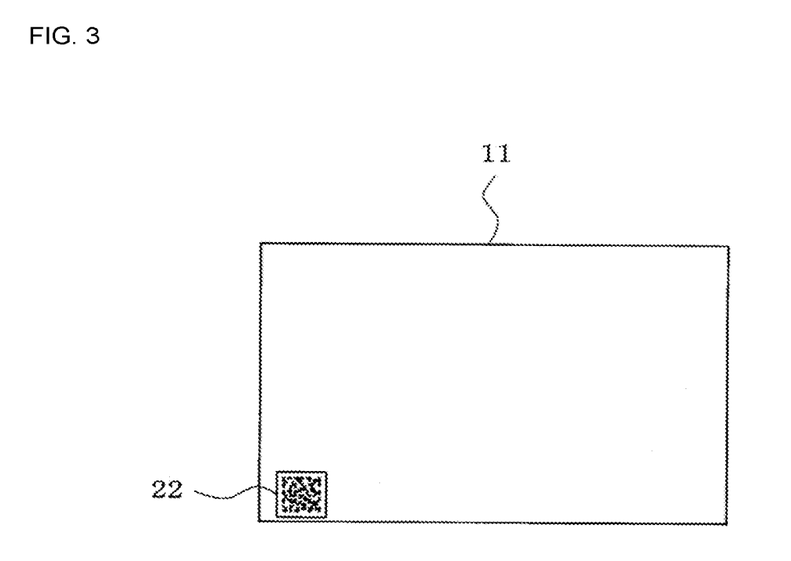
FIG. 3 is a plan view of a circuit board on which is affixed a board ID code label.
Figure 4:
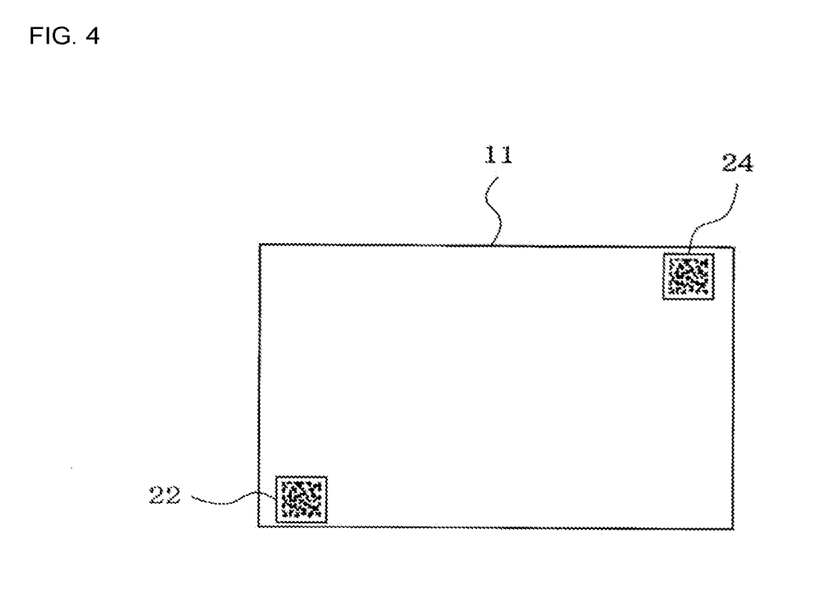
FIG. 4 is a plan view of a circuit board on which is affixed a board ID code label and a provisional board ID code label.

As shown in FIG. 2, multiple feeders 19 that supply components are removably set on feeder setting table 18 of each mounter module 17. Each mounter module 17 is provided with a conveyor (not shown) that conveys circuit board 11, a mounting head (not shown) that picks up components supplied from feeders 19 and mounts the components on circuit board 11, a head moving device (not shown) that moves the mounting head in the X-Y-Z directions, a component imaging camera (not shown) that images from below a component held by a suction nozzle (not shown) of the mounting head, mark imaging camera 21 that images reference position marks of circuit board 11, and the like.

Board ID code label 22 (refer to FIGS. 3 and 4), on which a board ID is recorded in the form a barcode, 2D code, or the like, is affixed to circuit board 11 that is loaded into the component mounting line. Mark imaging camera 21 of the furthest upstream mounter module 17 of modular component mounter 14 is used as a code reading device that reads the board ID by imaging board ID code label 22 of circuit board 11 and performing image processing.

Code label feeder 23 is removably set on feeder setting table 18 of the furthest upstream mounter module 17 alongside feeders 19. Code label 23 supplies provisional board ID code labels 24 (refer to FIG. 4) on which are recorded a provisional board ID (provisional board identification information) in the form of a barcode, 2D code, or the like.

A suction nozzle (not shown) held on the mounting head of the furthest upstream mounter module 17 functions as the code label affixing device; provisional board ID code label 24 supplied by code label feeder 23 is picked up by the suction nozzle of mounter module 17 and affixed at a specified position on circuit board 11 for which reading of the board ID failed. Provisional board ID code label 24 is affixed at a position separated from the position at which board ID code label 22 is affixed, such that an operator can easily distinguish provisional board ID code label 24 and board ID code label 22. Mark imaging camera 21 of the furthest upstream mounter module 17 is also used as the code reading device that reads the provisional board ID by imaging provisional board ID code label 24 and performing image processing.

The operating state of each device such as modular component mounter 14 that configures the component mounting line is managed by production management computer 31 that manages production of the component mounting line. Production management production 31, by performing the traceability information management program of FIG. 5, functions as the traceability information management device that performs management by linking traceability information (for example, used components, production time, used device name, production name, and the like) of circuit board 11 (a board on which components are mounted) to the board ID or the provisional board ID read by mark imaging camera 21 of the furthest upstream mounting module 17 of modular component mounter 14, and registering the traceability information in database 32.

Figure 5:
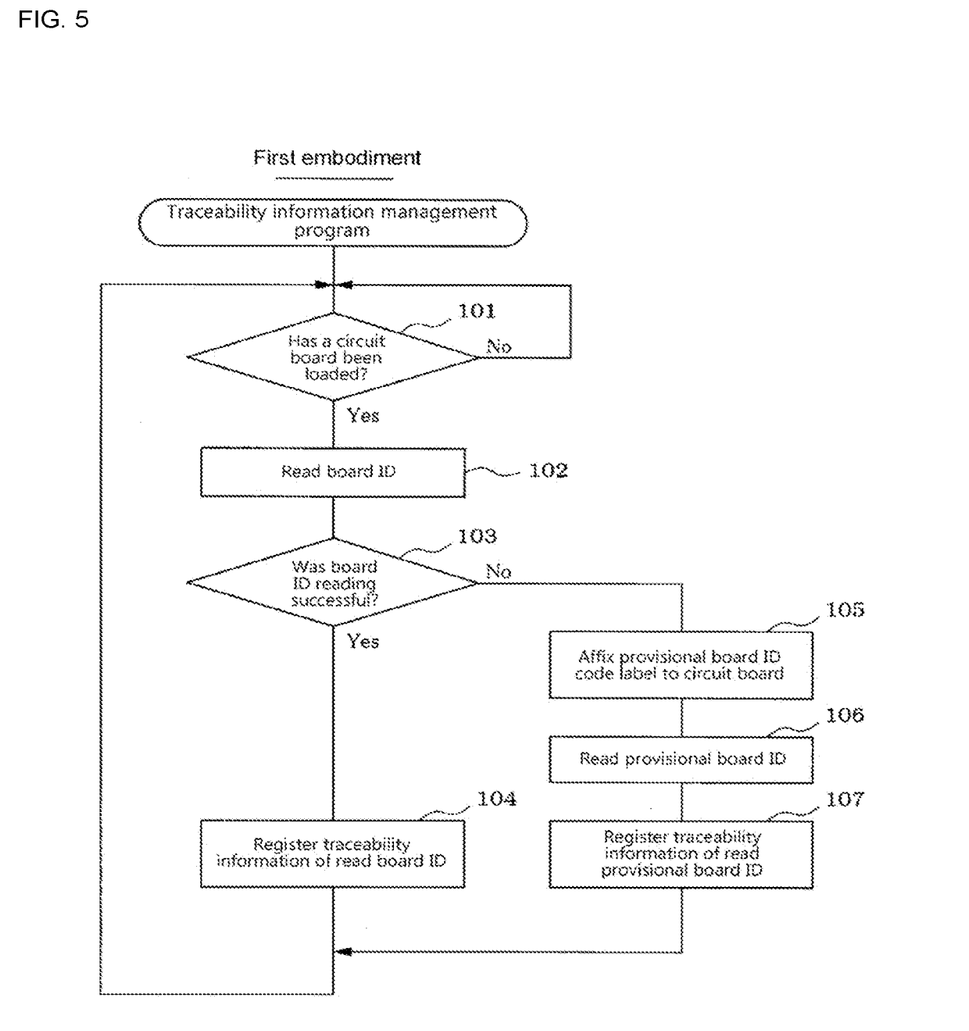
FIG. 5 is a flowchart showing the processing of the traceability information management program of the first embodiment.

The traceability information management program of FIG. 5 is performed by production management computer 31 as follows. After being started, in step 101, the program waits until circuit board 11 is loaded into the furthest upstream mounter module 17 of modular component mounter 14. Then, at the point when circuit board 11 is loaded into the furthest upstream mounter module 17, the program progresses to step 102 and the board ID is read by board ID code label 22 of circuit board 11 being imaged and image processed using mark imaging camera 21 of the furthest upstream mounter module 17.

Then, continuing to step 103, judgment is performed as to whether board ID reading was successful; if reading the board ID was judged successful, the program continues to step 4, with management being performed by the traceability information of circuit board 11 (board on which components are mounted) being linked to the read board ID and registered in database 32.

In contrast, if in step 103 it is judged that reading the board ID failed, the program continues to step 105, with provisional board ID code label 24 supplied by code label feeder 23 being picked up by a suction nozzle of mounter module 17 and affixed at a specified location of circuit board 11 for which reading of the board ID failed. Then, the program continues to step 106 and the provisional board ID is read by provisional board ID code label 24 of circuit board 11 being imaged and image processed using mark imaging camera 21 of the furthest upstream mounter module 17. Next, the program continues to step 107 and the traceability information of circuit board 11 (board on which components are mounted) is linked to the read provisional board ID and registered in database 32.

The program returns to step 101 after registering the traceability information of circuit board 11 (board on which components are mounted) linked to the read board ID or provisional board ID in the above step 104 or 107. By this, the program repeats processing to register traceability information in database 32 after reading the board ID or provisional board ID for each circuit board 11 that is loaded into the furthest upstream mounter module 17.

An operator, from circuit boards 11 (board on which components are mounted) unloaded from the component mounting line, extracts a circuit board 11 on which is affixed provisional board ID code label 24, reads the board ID and the provisional board ID of the circuit board 11 by scanning board ID code label 22 and provisional board ID code label 24 of the circuit board 11 with a code reading device (not shown) such as a barcode reader and sends the board ID and provisional board ID to production management computer 31, such that the ID of the traceability information of the circuit board 11 registered in database 32 is changed from the provisional board ID to the board ID.

Accordingly, even in a case in which reading the board ID of circuit board 11 loaded into the component mounting line fails, the traceability information management program is able to perform management by linking the traceability information of the circuit board 11 to the board ID and registering the information without stopping production. Even in a case in which the reading the board ID fails due to, for example, the printed state of board ID code label 22 of circuit board 11 loaded into the component mounting line, the board ID is able to be read by an operator manually scanning board ID code label 22 using a code reading device such as a barcode reader. Also, if the traceability information ID of circuit board 11 is changed from the provisional board ID to the proper board ID, even in a case in which new information is added to the traceability information of the circuit board 11 at a later stage, management can be performed using the same board ID as from the previous stage, thus management of traceability information is easy.

Further, in the first embodiment, mark imaging camera 21 loaded on the furthest upstream mounter module 17 is used as the code reading device, reading both the board ID and the provisional board ID, leading to the advantage that a dedicated code reading device (such as a barcode reader or an external camera) does not have to be provided, and the system configuration can be simplified. However, the present disclosure may have a configuration in which a dedicated code reading device (such as a barcode reader or an external camera) is provided.

Also, in the first embodiment, because code label feeder 23 is set on feeder setting table 18 of the furthest upstream mounter module 17 alongside feeders 19 that supply components, code label feeder 23 can be set making effective use of an empty slot on feeder setting table 18 of the furthest upstream mounter module 17, thus meeting the demand for reducing space used.

Note that, in the first embodiment, a suction nozzle of mounter module 17 is used as the code label affixing device that affixes provisional board ID code label 24 supplied by code label feeder 23 at a specified location on circuit board 11 for which reading of the board ID failed; however, a code label affixing device function may be loaded on code label feeder 23.

Second Embodiment

Figure 6:
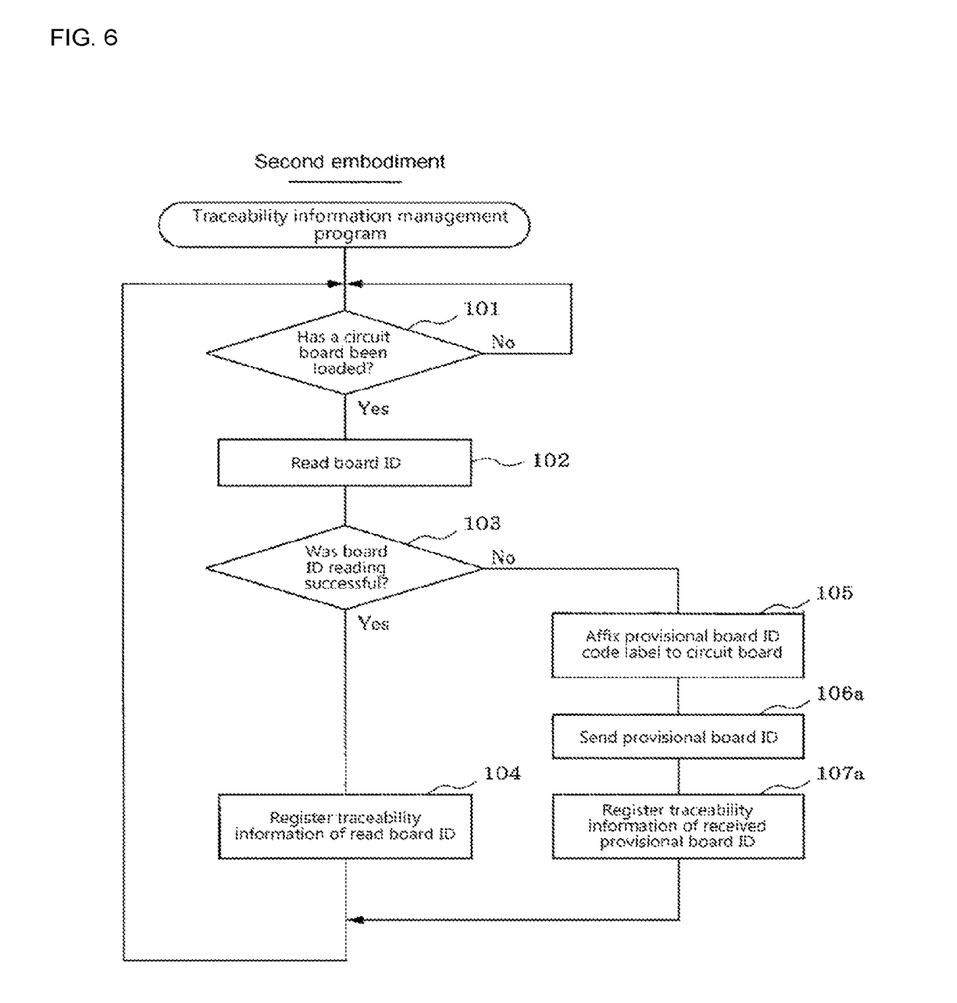
FIG. 6 is a flowchart showing the processing of the traceability information management program of the second embodiment.

Next, a second embodiment of the present disclosure is described using FIG. 6. However, for sections which are practically the same as the first embodiment, explanations are omitted or abbreviated, with descriptions largely given for sections which are different.

In the first embodiment, when reading the board ID fails, the provisional board ID is read by imaging provisional board ID code label 24 affixed to circuit board 11 and performing image processing using mark imaging camera 21 of the furthest upstream mounter module 17; however, in the second embodiment, by performing the traceability information management program of FIG. 6, the provisional board ID recorded on provisional board ID code label 24 affixed to circuit board 11 for which reading of the board ID failed is sent to production management computer 31 from code label feeder 23.

With the traceability information management program of FIG. 6, only processing of steps 106 and 107 of the traceability information management program of FIG. 5 described in the first embodiment are changed respectively to steps 106a and 107a; processing of steps 101 to 105 is the same. That is, in a case in which reading the board ID fails, after provisional board ID code label 24 supplied by code label feeder 23 is affixed at a specified location to circuit board 11 for which reading of the board ID failed (steps 103 to 105), the program continues to step 106a and the provisional board ID recorded on provisional board ID code label 24 affixed to circuit board 11 is sent to production management computer 31 from code label feeder 23. Then, the traceability information management program continues to step 107a and the traceability information of circuit board 11 (board on which components are mounted) is linked to the received provisional board ID and registered in database 32.

The same effects are achieved with the second embodiment as with the first embodiment. Note that, with the first and second embodiments described above, the board ID is read by the furthest upstream mounter module 17 of module component mounter 14, but the code reading device that reads the board ID, the code label feeder that supplies the provisional board ID code label, and the code label affixing device that affixes the provisional board ID code label to circuit board 11 for which reading of the board ID fails, may be provided at the board loading side of a device (such as solder printer 12) further upstream in the component mounting line than modular component mounter 14.

Also, the present disclosure may use laser marking, RFIDs, or the like as a "code label".

In addition, it goes without saying that various embodiments with changes that do not extend beyond the scope of the disclosure are possible such as those with changes to the configuration the component mounting line.

REFERENCE SIGNS LIST

11: circuit board; 12: solder printer; 13: print inspection machine; 14: modular component mounter; 15: reflow oven; 16: optical inspection machine; 17: mounter module; 18: feeder setting table; 19: feeder; 21: mark imaging camera (code reading device); 22: board ID code label; 23: code label feeder; 24: provisional board ID code label; 31: production management computer (traceability information management device); 32: database

The invention claimed is:

1. A component mounting line traceability information management system that manages traceability information of a board on which components are mounted produced at the component mounting line provided with a component mounter that mounts components on a circuit board, the component mounting line traceability information management system comprising:
   a board ID code label assigned to a circuit board that is loaded into the component mounting line, board identification information (hereinafter referred to as "board ID") being coded and stored on the board ID code label;
   a code reading device that reads the board ID from the board ID code label of the circuit board loaded into the component mounting line;
   a code label feeder that assigns a provisional board ID code label on which is stored a coded provisional board ID;
   a code label assigning device that assigns the provisional board ID code label, assigning of which was prepared at the code label feeder when the code reading device failed to read the board ID, to the panel ID for which reading failed; and
   a traceability information management device that performs management by linking traceability information of a board on which components are mounted to the board ID or the provisional board ID read by the code reading device, and registering the traceability information in a database.

2. A component mounting line traceability information management system that manages traceability information of a board on which components are mounted produced at the component mounting line provided with a component mounter that mounts components on a circuit board, the component mounting line traceability information management system comprising:
   a board ID code label affixed to a circuit board that is loaded into the component mounting line, board identification information (hereinafter referred to as "board ID") being coded and stored on the board ID code label;
   a code reading device that reads the board ID from the board ID code label of the circuit board loaded into the component mounting line;
   a code label feeder that supplied a provisional board ID code label on which is stored a coded provisional board ID;
   a code label affixing device that affixes the provisional board ID code label, supplying of which was performed by the code label feeder when the code reading device failed to read the board ID, to the panel ID for which reading failed; and
   a traceability information management device that performs management by linking traceability information of a board on which components are mounted to the board ID or the provisional board ID read by the code reading device, and registering the traceability information in a database.

3. The component mounting line traceability information management system according to claim 2, wherein
   a mark imaging camera that images reference position marks of the circuit board is provided on the component mounter, and
   the code reading device reads the board ID by imaging the board ID code label of the circuit board with the mark imaging camera and performing image processing, and reads the provisional board ID by imaging the provisional board ID code label affixed to the circuit board by the code label affixing device when reading of the panel ID fails with the mark imaging camera and performing image processing.

4. The component mounting line traceability information management system according to claim 2, wherein
   the code label feeder sends the provisional board ID stored on the provisional board ID code label affixed to the circuit board for which reading of the board ID failed to the traceability information management device.

5. The component mounting line traceability information management system according to claim 2, wherein
   a suction nozzle of the component mounter is used as the code label affixing device, and the provisional board ID code label supplied by the code label feeder is affixed to the circuit board for which reading of the board ID failed by the suction nozzle of the component mounter.

6. The component mounting line traceability information management system according to claim 2, wherein
   the code label feeder is set on a feeder setting table of the component mounter alongside a feeder that supplies components.

7. A component mounting line traceability information management method for managing traceability information of a board on which components are mounted using the component mounting line traceability information management system disclosed in claim 2, wherein
   an operator, from boards on which components are mounted that are unloaded from the component mounting line, extracts a board on which components are mounted on which is affixed the provisional board ID code label, reads the board ID and provisional board ID of the board on which components are mounted by scanning the board ID code label and the provisional board ID code label of the board on which components are mounted and sends the board ID and the provisional board ID to the traceability information management device, such that the ID of the traceability information of the board on which components are mounted that is registered in the database is changed from the provisional board ID to the board ID.

\* \* \* \* \*